(12) United States Patent
Snyder et al.

(10) Patent No.: US 8,946,877 B2
(45) Date of Patent: Feb. 3, 2015

(54) SEMICONDUCTOR PACKAGE INCLUDING CAP

(75) Inventors: Rick Snyder, Windsor, CO (US); Joel Philliber, Fort Collins, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 266 days.

(21) Appl. No.: 12/893,044

(22) Filed: Sep. 29, 2010

(65) Prior Publication Data

US 2012/0074555 A1 Mar. 29, 2012

(51) Int. Cl.
*H01L 33/00* (2010.01)
*H01L 31/0203* (2014.01)
*H01L 31/102* (2006.01)
*H01L 29/66* (2006.01)
*H01L 23/06* (2006.01)
*H01L 23/12* (2006.01)
*H01L 23/00* (2006.01)
*H01L 23/10* (2006.01)

(52) U.S. Cl.
CPC ............... *H01L 24/32* (2013.01); *H01L 23/10* (2013.01); *H01L 2224/29018* (2013.01); *H01L 2224/29023* (2013.01); *H01L 2224/29034* (2013.01); *H01L 2224/29084* (2013.01); *H01L 2224/29144* (2013.01); *H01L 2224/29166* (2013.01); *H01L 2224/9202* (2013.01); *H01L 2924/0105* (2013.01); *H01L 2924/01079* (2013.01); *H01L 2924/16235* (2013.01); *H01L 2924/01033* (2013.01); *H01L 2924/01074* (2013.01); *H01L 2924/0132* (2013.01)
USPC ............... 257/684; 257/98; 257/99; 257/433; 257/458; 257/656; 257/704; 257/E29.336; 257/E33.046; 257/E23.181

(58) Field of Classification Search
CPC ........... H01L 2924/15165; H01L 2224/24227; H01L 2924/15153; H01L 2924/01074; H01L 2924/3011; H01L 2924/00014; H01L 2924/12031; H01L 2924/16235; H01L 2924/161; H01L 2924/1611; H01L 2924/1615; H01L 2924/16151; H01L 2924/16152; H01L 2924/16153; H01L 2924/1616; H01L 2924/1617; H01L 2924/16171; H01L 2924/162; H01L 2924/16251; H01L 2924/163; H01L 2924/1631; H01L 2924/16315; H01L 2924/1632; H01L 2924/165; H01L 2924/166; H01L 2224/29018; H01L 2224/29023; H01L 2224/29034; H01L 2224/9202; H01L 23/10; H01L 23/04; H01L 24/32; H01L 33/0012; H01L 51/4293; H01L 2021/50; H01L 21/4817; H01L 21/50; H01L 29/868
USPC .......... 257/458, 656, E31.061, E29.336, 684, 257/E31.087, 98, 99, 433, 704, E33.046
See application file for complete search history.

(56) References Cited

U.S. PATENT DOCUMENTS

| | | | |
|---|---|---|---|
| 7,457,334 B2 | 11/2008 | Cho | |
| 7,777,232 B2 * | 8/2010 | Hayakawa et al. | 257/79 |
| 7,786,496 B2 * | 8/2010 | Yamazaki et al. | 257/98 |
| 2002/0179921 A1 * | 12/2002 | Cohn | 257/99 |

(Continued)

OTHER PUBLICATIONS

"Packageless PIN Diodes Handle Higher Power", Oct. 13, 2005, http://mobiledevdesign.com/hardware_design/packageless-PIN-diodes/.

*Primary Examiner* — Teresa M Arroyo (57) ABSTRACT

A semiconductor package comprises: a substrate comprising a semiconductor device; a cap comprising a seal ring disposed over a surface of the cap; and a gap between the substrate and the surface of the cap. The seal ring comprises a tread comprising at least two columns.

22 Claims, 10 Drawing Sheets

(56) References Cited

U.S. PATENT DOCUMENTS

| | | | |
|---|---|---|---|
| 2003/0201447 A1* | 10/2003 | Yamazaki et al. | 257/79 |
| 2004/0238827 A1* | 12/2004 | Takayama et al. | 257/79 |
| 2005/0062122 A1* | 3/2005 | Gallup et al. | 257/432 |
| 2006/0108675 A1* | 5/2006 | Colgan et al. | 257/684 |
| 2006/0228822 A1* | 10/2006 | Hayakawa et al. | 438/34 |
| 2007/0004079 A1* | 1/2007 | Geefay et al. | 438/106 |
| 2007/0012654 A1* | 1/2007 | Kim et al. | 216/2 |
| 2007/0187790 A1* | 8/2007 | Takahashi et al. | 257/433 |
| 2007/0202623 A1 | 8/2007 | Gao et al. | |
| 2007/0218650 A1* | 9/2007 | Takayama et al. | 438/458 |
| 2008/0054265 A1* | 3/2008 | Osame et al. | 257/59 |
| 2008/0158137 A1* | 7/2008 | Yoshida | 345/102 |
| 2009/0001527 A1 | 1/2009 | Mondi et al. | |
| 2009/0071807 A1* | 3/2009 | Kominato et al. | 200/181 |
| 2009/0117681 A1* | 5/2009 | Maruyama et al. | 438/59 |
| 2009/0129783 A1 | 5/2009 | Ori et al. | |
| 2009/0315184 A1* | 12/2009 | Tokitoh | 257/758 |

* cited by examiner

SEMICONDUCTOR PACKAGE INCLUDING CAP

BACKGROUND

Semiconductor devices are often provided in a package, with electrical connections being made through contacts on the package. The packaging often adds to parasitic capacitance, parasitic inductance and parasitic resistance to the semiconductor device. Among other drawbacks, these parasitic elements can increase electrical losses, and can adversely impact the performance of the semiconductor device, especially at higher operational frequencies.

What is needed, therefore, is a semiconductor package that overcomes at least the drawbacks of known semiconductor packages described above.

BRIEF DESCRIPTION OF THE DRAWINGS

The present teachings are best understood from the following detailed description when read with the accompanying drawing figures. The features are not necessarily drawn to scale. Wherever practical, like reference numerals refer to like features.

DETAILED DESCRIPTION

In the following detailed description, for purposes of explanation and not limitation, representative embodiments disclosing specific details are set forth in order to provide a thorough understanding of the present teachings. Descriptions of known devices, materials and manufacturing methods may be omitted so as to avoid obscuring the description of the example embodiments. Nonetheless, such devices, materials and methods that are within the purview of one of ordinary skill in the art may be used in accordance with the representative embodiments.

Figure 1:
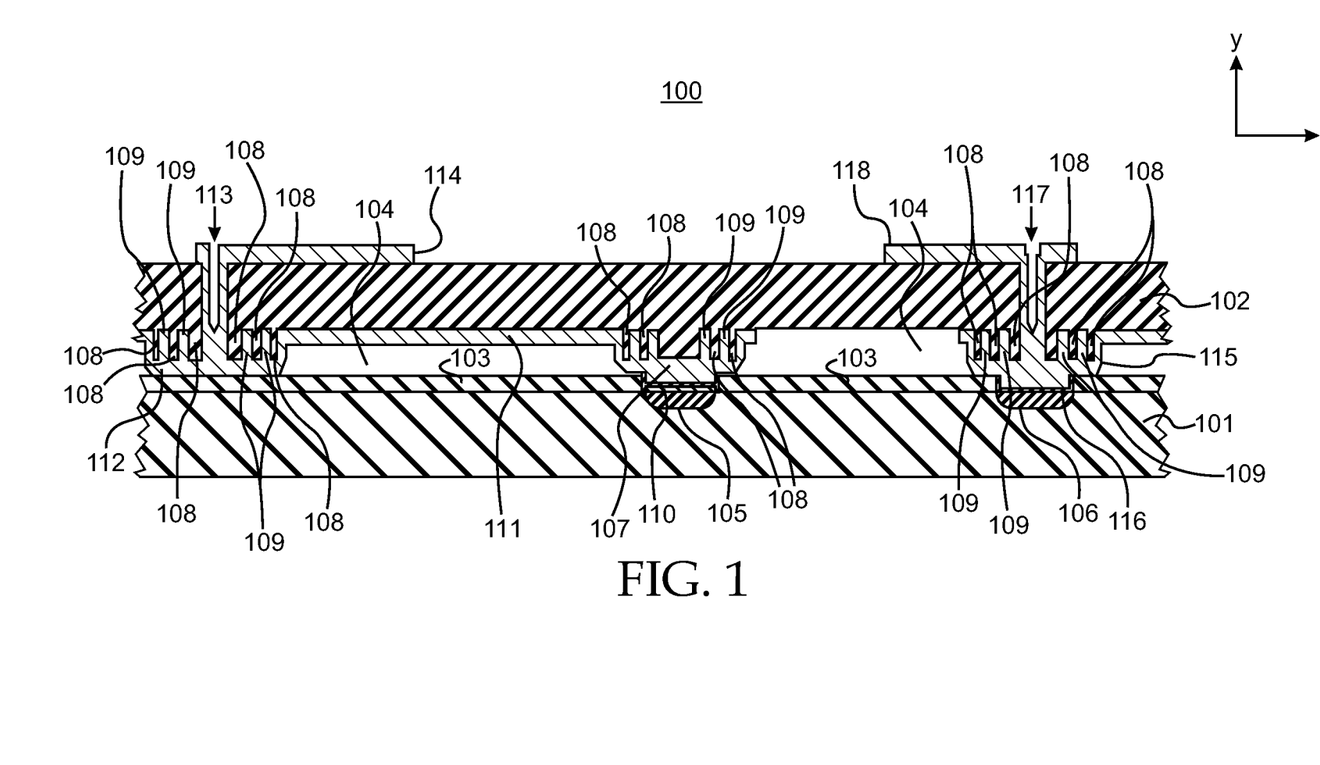
FIG. 1 shows a partial cross-sectional view of a semiconductor package in accordance with a representative embodiment.

FIG. 1 shows a cross-sectional view of a semiconductor package 100 in accordance with a representative embodiment. The semiconductor package 100 comprises a substrate 101 and a cap 102 disposed over the substrate 101. The substrate 101 is a semiconductor material selected for the particular active semiconductor device being packaged according to the present teachings. For example, the semiconductor material may be a binary semiconductor material (e.g., Group III-IV and Group IV-VI semiconductor materials), a ternary semiconductor material, silicon (Si) or silicon-germanium (SiGe). The active regions of the active semiconductor device are formed by known doping methods. In a representative embodiment, the semiconductor material of the substrate is undoped (intrinsic) semiconductor with active regions formed by selective doping. Moreover, the present teachings contemplate the use of synthetic diamond fabricated by a known chemical vapor deposition (CVD) method for the substrate 101. Moreover, the substrate may be a glass or quartz material, or may be an electrically insulating material known to one of ordinary skill in the art. The material selected for the substrate 101 must be amenable to the forming of features and active semiconductor devices as contemplated by the present teachings.

In a representative embodiment, the cap 102 may be made from the same material as the substrate 101, however is generally not electrically conductive. As such, the cap 102 may be made from an undoped binary semiconductor material (e.g., Group III-IV and Group IV-VI semiconductor materials), an undoped ternary semiconductor material, undoped silicon (Si) or undoped silicon-germanium (SiGe). Alternatively, the cap 102 may be made from quartz or glass. Generally, and as will become clearer as the present description continues, the cap 102 is made from a material amenable to the formation of certain features such as columns and grooves using known patterning etching methods and materials.

An optional passivation layer 103 is provided over the substrate 101, and a gap 104 is provided between the substrate 101 and the cap 102. As described more fully below, the gap 104 is generally filled with air or suitable gas, or is a vacuum, and beneficially reduces parasitic capacitive coupling between the active semiconductor device of the semiconductor package 100 and electrical contacts to the active semiconductor device.

In a representative embodiment, the active semiconductor device is a two terminal device. For purposes of illustration, the two terminal device is a diode, such as a p-type semiconductor, intrinsic (i) semiconductor, n-type semiconductor (PIN) diode. The PIN diode is formed between a p-doped region 105, an n-doped region 106, and the intrinsic semiconductor of the substrate 101 therebetween. Furthermore, three terminal active semiconductor devices such as bipolar transistors, pseudomorphic high electron mobility transistors (pHEMT) and metal oxide semiconductor (MOS) transistors are contemplated for use in the semiconductor package 100. Finally, the present teachings contemplate the inclusion of bulk acoustic wave (BAW) devices such as film bulk acoustic wave resonators (FBARs) and supporting active semiconductor devices, passive electrical components and circuitry in the semiconductor package 100. Such three terminal devices, BAW devices and supporting active semiconductor devices, passive electrical components and circuitry may be formed in and over the substrate 101 by known methods using known materials.

A first contact 107 comprises columns 108 and grooves 109 formed in the cap 102. As described more fully herein, the first contact 107 comprises electrically conductive material provided over the columns 108 and in the grooves 109. The columns 108 and grooves 109 form a "tread" that fosters strong mechanical bonding between the cap 102 and the substrate 101, and a good electrical connection, as needed. Moreover, and as described more fully herein, the "tread" structure can be implemented in a seal ring between the substrate 101 and the cap 102 to provide a substantially hermetic seal. This provides protection to the active semiconductor, passive electrical components (not shown) and circuitry within the seal provided by the seal ring.

An electrical connection 111 comprising the same material(s) as the first contact 107 is provided over an inner surface of the cap 102 as shown. The electrical connection 111 provides electrical contact to a second contact 112. Like the first contact 107, the second contact 112 comprises a "tread" comprising columns 108 and grooves 109 formed in the cap 102 with electrically conductive material formed over the columns 108 and in the grooves 109. In a representative embodiment, the electrically conductive material of the first contact 107 comprises one or more of titanium (Ti), titanium nitride (TiN), titanium tungsten (TiW), Titanium Tungsten Oxynitride (TiWON), and gold (Au). In a representative embodiment, the first contact 107 comprises a "stack" of two or more of these materials, with gold making the initial electrical connection to an ohmic contact 110 of the p-doped region 105. More generally, the electrically conductive material of the first contact 107, the second contact 112 and the electrical connection 111 each comprise a stack comprising an adhesion layer/a diffusion barrier/an adhesion layer/gold. For example, the stack of the electrically conductive material is TiW/TiWON/TiW/Au. Each TiW layer has a thickness of approximately 150 A to approximately 300 A; the TiWON layer has a thickness of approximately 500 A to approximately 1000 A; and the gold layer has a thickness of approximately 1.0 µm to approximately 3.0 µm. In a representative embodiment, the TiW and TiWON layers are deposited by a known sputter deposition method. Alternatively, the TiW, TiWON and Au could be provided by a known evaporation method. The gold layer is deposited by a known sputtering method.

A first via 113 is provided through the cap 102 connects the second contact 112 to a first contact pad 114 disposed over an outer surface of the cap 102 as shown. The first via 113 comprises electrically conductive material provided therein and provides an electrical connection between second contact 112 and the first contact pad 114. The first contact pad 114 and the first via 113 illustratively comprise the electrically conductive material used to form the second contact 112. In the representative embodiment, the first contact pad 114 is ultimately connected to the p-doped region 105 and thus forms an anode of the PIN diode.

The semiconductor package 100 comprises a third contact 115. The third contact 115 comprises columns 108 and grooves 109 formed in the cap 102, with the third contact 115 formed by providing electrically conductive material over the columns 108 and in the grooves 109. As noted above, the columns 108 and grooves 109 beneficially form a "tread." One or more of titanium (Ti), titanium nitride (TiN), titanium tungsten (TiW), Titanium Tungsten Oxynitride (TiWON), and gold (Au) form the third contact 115. Typically, the third contact 115 comprises the same electrically conductive material as the first contact 107. For example, the third contact 115 comprises a "stack" of TiW/TiWON/TiW/Au. The layer of gold of the stack makes immediate contact with a metal layer (not shown) disposed over the ohmic contact 116 of the p-doped region 105.

A second via 117 is provided through the cap 102 and connects the third contact 115 to a second contact pad 118 disposed over an outer surface of the cap 102 as shown. In the representative embodiment, the second contact pad 118 is ultimately connected to the n-doped region 106 and thus forms a cathode of the PIN diode. The second via 117 comprises electrically conductive material provided therein and provides an electrical connection between third contact 115 and the second contact pad 118. The second contact pad 118 and the second via 117 each illustratively comprise the electrically conductive material used to form the third contact 115.

Illustratively, the first contact pad 114 and the second contact pad 118 each comprise a "stack" of one or more of titanium (Ti), titanium nitride (TiN), titanium tungsten (TiW), Titanium Tungsten Oxynitride (TiWON), and gold. Illustratively, the stack comprises TiW/TiWON/TiW/Au. Each TiW layer has a thickness of approximately 150 A to approximately 300 A; the TiWON layer has a thickness of approximately 500 A to approximately 1000 A; and the gold layer has a thickness of approximately 2000 A. After patterning the first and second contact pads 114,118, gold is plated over the first and second contact pads 114,118 and in the first and second vias 113, 117. Illustratively, the plated gold layer has a thickness of approximately 1.0 µm to approximately 2.0 µm.

The first contact pad 114 and the second contact pad 118 are provided comparatively far from the active semiconductor device (e.g., PIN diode) by virtue of the structure of the semiconductor package 100. Illustratively, the first contact pad 114 and the second contact pad 118 are vertically separated (y-direction in the coordinate system shown in FIG. 1) by approximately 50 µm to approximately 600 µm from the active semiconductor device. Moreover, by placing the first and second contact pads 114,118 on an outer surface of the cap 102, and by providing the gap 104 with either air or other low-dielectric constant (low $\in_r$) material between the first and second contact pads 114,118 and the active semiconductor device, the electrical distance between the active semiconductor device and the first and second contact pads 114,118 is increased. This results in a beneficial reduction in the capacitive coupling between the active semiconductor device and the first and second contact pads 114,118.

Figure 2:
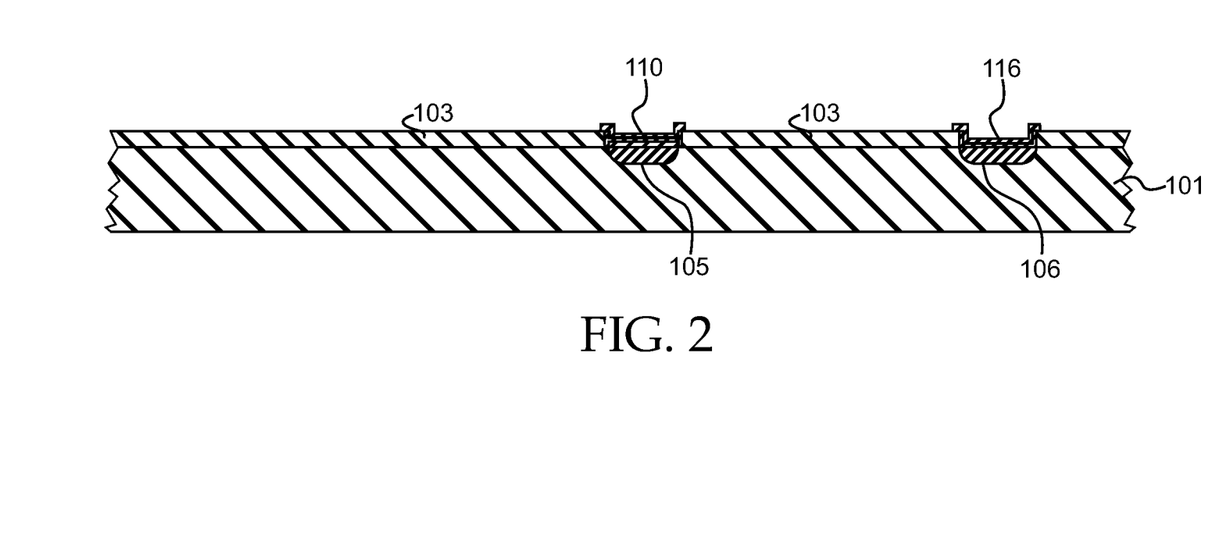
FIG. 2 shows a partial cross-sectional view of a substrate of a semiconductor package in accordance with a representative embodiment.

FIG. 2 shows a cross-sectional view of the substrate 101 of semiconductor package 100 in accordance with a representative embodiment. The p-doped region 105 and the n-doped region 106 are formed in the substrate 101 by a known doping or implantation method, to provide the desired doping level in the substrate 101. The ohmic contacts 110,116 are formed by a known deposition technique or plating technique and comprise gold or a metal stack with gold as the outermost layer of the metal stack. The resultant PIN diode is thus a "horizontal" (x-direction in the coordinate system of FIG. 1) structure formed by the p-doped region 105, the n-doped region 106 and the intrinsic semiconductor of the substrate 101 therebetween. Illustratively, the p-doped region 105 and the n-doped region 106 are separated by approximately 15 µm to 200 µm in the horizontal PIN diode formed in the substrate 101. It is emphasized that the horizontal PIN diode is merely illustrative of the active semiconductor device of the semiconductor package 100. Three terminal devices (not shown) and other two terminal devices (e.g., Schottky diode, or p-n junction diode) are contemplated for inclusion in the semiconductor package 100 and may be formed in and over the substrate 101 by known methods using known materials. Moreover, and as described in connection with a representative embodiment, "vertical" two terminal semiconductor devices and three terminal semiconductor devices are contemplated for inclusion in the semiconductor package 100 and may be formed in and over the substrate 101 by known methods using known materials.

Figure 3:
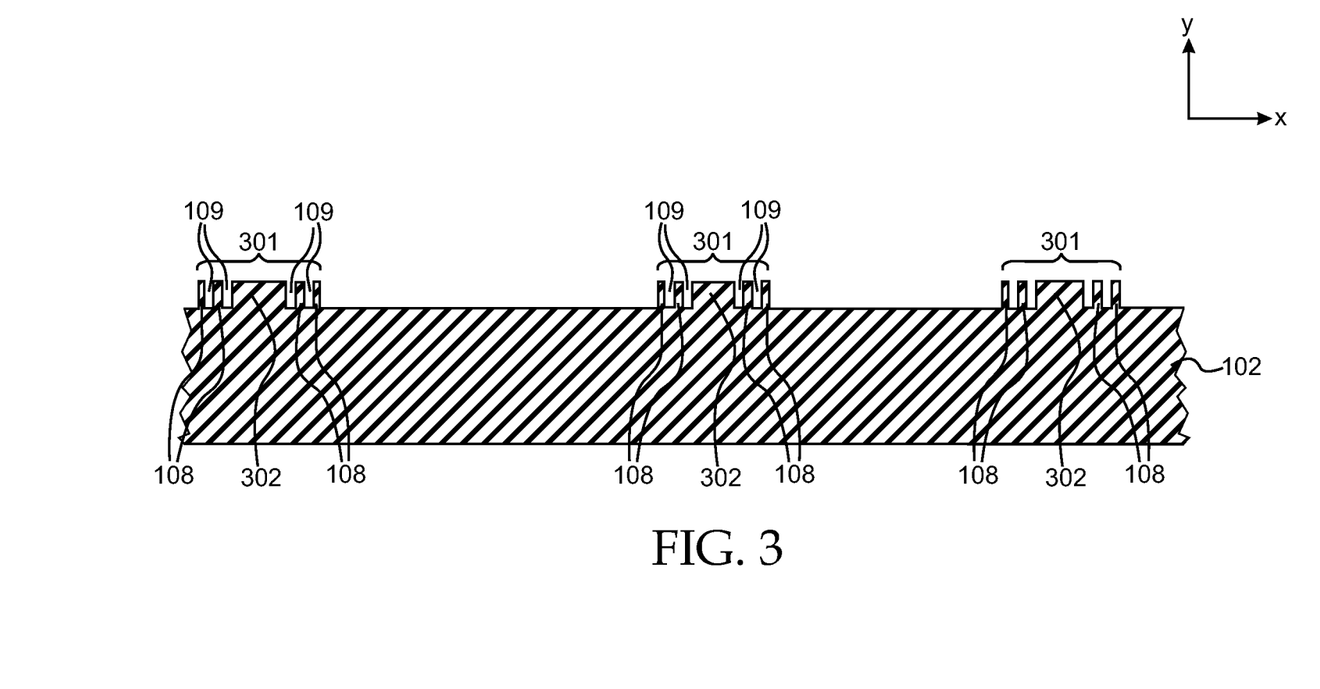
FIG. 3 shows a partial cross-sectional view of a cap of a semiconductor package in accordance with a representative embodiment.

FIG. 3 shows the cap 102 during fabrication in accordance with a representative embodiment. Notably, FIG. 3 shows the cap 102 before being "thinned" and before the forming of first and second vias 113, 117 and first and second contact pads 114, 118. Treads 301 are formed in the cap 102. The treads 301 comprise columns 108 and grooves 109, and a center column 302 that has a greater width (x-dimension in the coordinate system shown in FIG. 3) than the columns 108. As described more fully below, first and second vias 113, 117 may be formed by etching the center column(s) 302, and additional columns 108 and grooves 109 are provided. If vias are not provided in a particular tread, the center column(s) 302 are not etched (e.g., see first contact 107 in FIG. 4A).

The columns 108 and grooves 109 are illustratively formed by a known dry etching technology including reactive ion etching (RIE), or deep RIE (e.g., the so-called "Bosch" method), or sputter etching, or vapor phase etching. Such dry etching methods are beneficial in providing comparatively high aspect ratio features (e.g., columns 108) in the cap 102. For purposes of illustration, the columns 108 have a width of approximately 1.25 μm to approximately 2.0 μm and a height (y-dimension in the coordinate systems shown in FIG. 3) of approximately 1.5 μm to approximately 2.0 μm. Also by way of illustration, the grooves 109 have a width of approximately 1.5 μm to approximately 2.0 μm and a depth (y-dimension in the coordinate systems shown in FIG. 3) of approximately 1.5 μm to approximately 2.0 μm. The center columns 302 have a width (x-dimension in the coordinate system shown in FIG. 3) of 15.0 μm to approximately 20.0 μm, and a depth (y-dimension in the coordinate system shown in FIG. 3) of approximately 1.5 μm to approximately 2.0 μm. It is emphasized that rather than etching columns 108 and grooves 109 to form treads 301 into the cap 102 as described above in connection with representative embodiments, the columns 108 and grooves 109 may be fabricated by a known additive process. For example, the gold or other suitable bonding material could be deposited directly onto the inner surface of the cap 102 and then selectively etched to form the columns 108 and grooves 109 of the treads 301 from the bonding material.

Vias (e.g., first and second vias 113,117) are formed in the cap 102 by first patterning and etching the surface of the cap 102, leaving the tread pattern consisting of the center columns 302, columns 108 and grooves 109 using one of the noted dry-etching methods (e.g., DRIE). To provide openings for vias (e.g., first and second vias 113,117), the center columns 302 are etched to a depth (y-dimension in the coordinate system shown in FIG. 3) in the range of approximately 50 μm to approximately 600 μm, depending on the desired thickness of the cap 102. After etching the center columns 302 to provide openings for the vias (e.g., first and second vias 113, 117), the cap 102 is thinned to provide the vias extending from one surface (e.g., outer surface) of the cap 102 through to the opposing surface (e.g., inner surface) of the cap. A known back-grinding method is used to thin the cap 102 and expose the vias (e.g., first and second vias 113, 117).

Figure 4A:
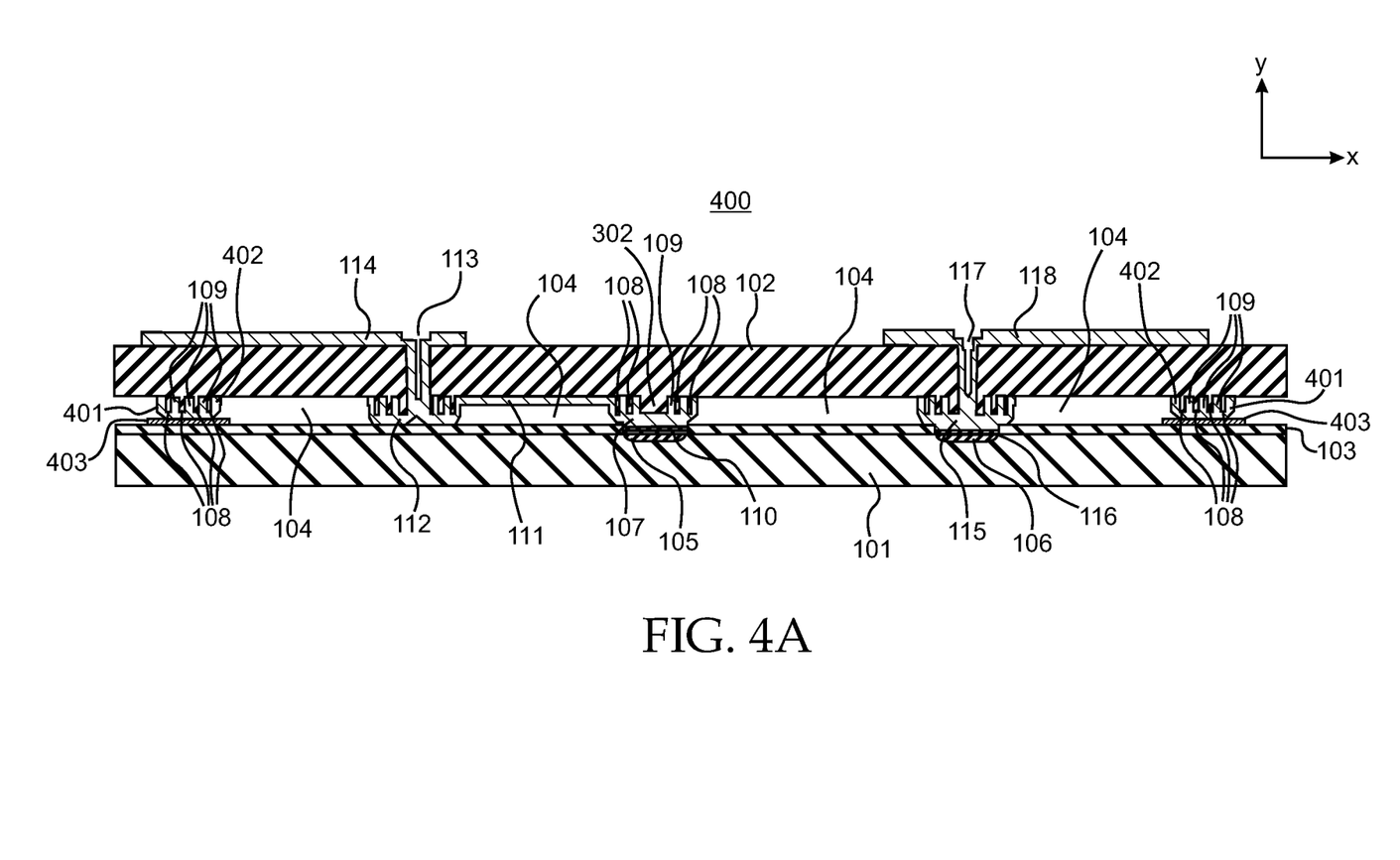
FIG. 4A shows a cross-sectional view of a semiconductor package in accordance with a representative embodiment.

FIG. 4A shows a cross-sectional view of a semiconductor package 400 in accordance with a representative embodiment. The semiconductor package includes features common to those described above in connection with representative embodiments of FIGS. 1-3. Generally, the details of these common features are not repeated in order to avoid obscuring the description of the semiconductor package.

The semiconductor package 400 comprises substrate 101 and cap 102 disposed over the substrate 101. The optional passivation layer 103 is provided over the substrate 101, and the gap 104 is provided between the substrate 101 and the cap 102.

In a representative embodiment, the active semiconductor device is a two terminal device or a three terminal device. Again, for purposes of illustration, the two terminal device is a diode, such as a p-type semiconductor, intrinsic (i) semiconductor, n-type semiconductor (PIN) diode. The PIN diode is formed between a p-doped region 105, an n-doped region 106, and the intrinsic semiconductor of the substrate 101 therebetween.

The first contact 107 comprises center column 302, columns 108 and grooves 109 formed in the cap 102, with the first contact 107 formed by providing electrically conductive material over the columns 108 and in the grooves 109. The center column 302, columns 108 and grooves 109 form a "tread" that fosters strong mechanical bonding between the cap 102 and the substrate 101, and a good electrical connection, as needed.

Electrical connection 111 provides electrical contact to the second contact 112.

The second contact 112 comprises columns 108 and grooves 109 formed in the cap 102, with the second contact 112 being formed by providing electrically conductive material over the columns 108 and in the grooves 109. As noted above, the columns 108 and grooves 109 beneficially form a "tread."

The first via 113 is provided through the cap 102 and electrically connects the second contact 112 to the first contact pad 114 disposed over an outer surface of the cap 102 as shown. The first contact pad 114 is ultimately connected to the p-doped region 105 and thus forms an anode of the PIN diode.

The semiconductor package 400 comprises third contact 115. The third contact 115 comprises columns 108 and grooves 109 formed in the cap 102, with the third contact 115 being formed by providing electrically conductive material over the columns 108 and in the grooves 109. As noted above, the columns 108 and grooves 109 beneficially form a "tread."

The second via 117 is provided through the cap 102 and electrically connects the third contact 115 to the second contact pad 118 disposed over an outer surface of the cap 102 as shown. In the representative embodiment, the second contact pad 118 is ultimately connected to the n-doped region 106 and thus forms a cathode of the PIN diode.

The semiconductor package 400 comprises a seal ring 401 disposed about the perimeter of the cap 102 and over a layer 403 of gold or other suitable metal, which may be referred to as the "race track." The seal ring 401 comprises columns 108 and grooves 109 as described above. Bonding layer 402 is provided over the columns 108 and in the grooves 109 as shown. The layer 403 is provided over the inner surface of the substrate 101 and about the perimeter of the substrate 101 in a pattern that mirrors the pattern of the seal ring 401.

In a representative embodiment, the bonding layer 402 comprises a stack comprising an adhesion layer/a diffusion barrier/an adhesion layer/gold. Illustratively, the stack of the bonding layer is TiW/TiWON/TiW/Au. Each TiW layer has a thickness of approximately 150 A to approximately 300 A; the TiWON layer has a thickness of approximately 500 A to approximately 1000 A; and the gold layer has a thickness of approximately 1.0 μm to approximately 3.0 μm. In a representative embodiment, the TiW and TiWON layers are deposited by a known sputter deposition method. Alternatively, the TiW and TiWON could be provided by a known evaporation method. The gold layer is deposited by a known sputtering method. Notably, gold is used as the "outermost" layer in the "stack" to provide a comparatively low ohmic loss conductive layer. Moreover, gold fosters the formation of a substantially hermetic seal between the treads of the seal ring 401 of the cap 102, and the layer 403 on the substrate 101 through the application of heat and pressure during the bonding of the cap 102 to the substrate 101 to form a thermocompression bond. The use of conductive materials for the bonding layer 402 facilitates fabrication efficiency because the same material(s) can be used for the first, second and third contacts 107, 112 and 115, the "fill" materials for the first and second vias 113, 117, and for the layer 403. It is noted, however, that the material used for the bonding layer 402 may be other than an electrically conductive material(s). Illustratively, the bonding layer 402 may be benzocyclobutene (BCB) or polyimide. Generally, the bonding layer 402 comprises a material useful in providing a substantially hermetic seal between the substrate 101 and the cap 102. As such, the active semiconductor device (e.g., PIN diode shown in FIG. 4A), other active semiconductor devices (not shown), passive electrical components (not shown) and circuitry provided between the substrate 101 and the cap 102 that are provided within the perimeter formed by the seal ring 401 and layer 403 are substantially hermetically sealed and generally require no additional/external packaging.

The "tread" structure accorded by the columns 108 and grooves 109 of the seal ring 401 allows for the secured bonding with the bonding layer 402 of the substrate 101 to the cap 102. As noted above, when the cap 102 contacts the substrate 101 during the sealing process, the application of pressure (in the direction dimension of the coordinate system of FIG. 4A) and the application of heat causes the columns 108 and grooves 109 to form a comparatively secure bond between the cap 102 and the substrate 101. The bonding process is performed using a known bonding apparatus. The process consists of using two sets of optical objectives to align the cap 102 to the substrate 101 using photo alignment marks. Upon alignment, the layer 403 makes contact with the bonding layer 402 disposed about the seal ring 401. The width of the layer 403 on the substrate is approximately 20 μm wider (in the x-dimension of the coordinate system shown in FIG. 4A) than the treads of the seal ring 401 on the cap 102. This allows for a registration error of up to 10 μm in the ±x direction in the coordinate system shown.

After the cap 102 and the substrate 101 are aligned, heat and pressure are applied thereby causing the bonding layer 402 to fuse the bonding layer 402 over the seal ring 401 to the layer 403 disposed over substrate 101. This creates the thermocompression bond between the bonding layer 402 and the layer 403 disposed over the substrate 101. As noted above, in an illustrative embodiment, the bonding layer 402 comprises a stack of material layers, with a layer of gold as the outermost layer of the stack. Moreover, the layer 403 is illustratively gold. Using gold, for example, for the outermost layer of the stack of the bonding layer 402 and for the layer 403 fosters the formation of the substantially hermetic seal between the cap 102 and the substrate 101.

Figure 4B:
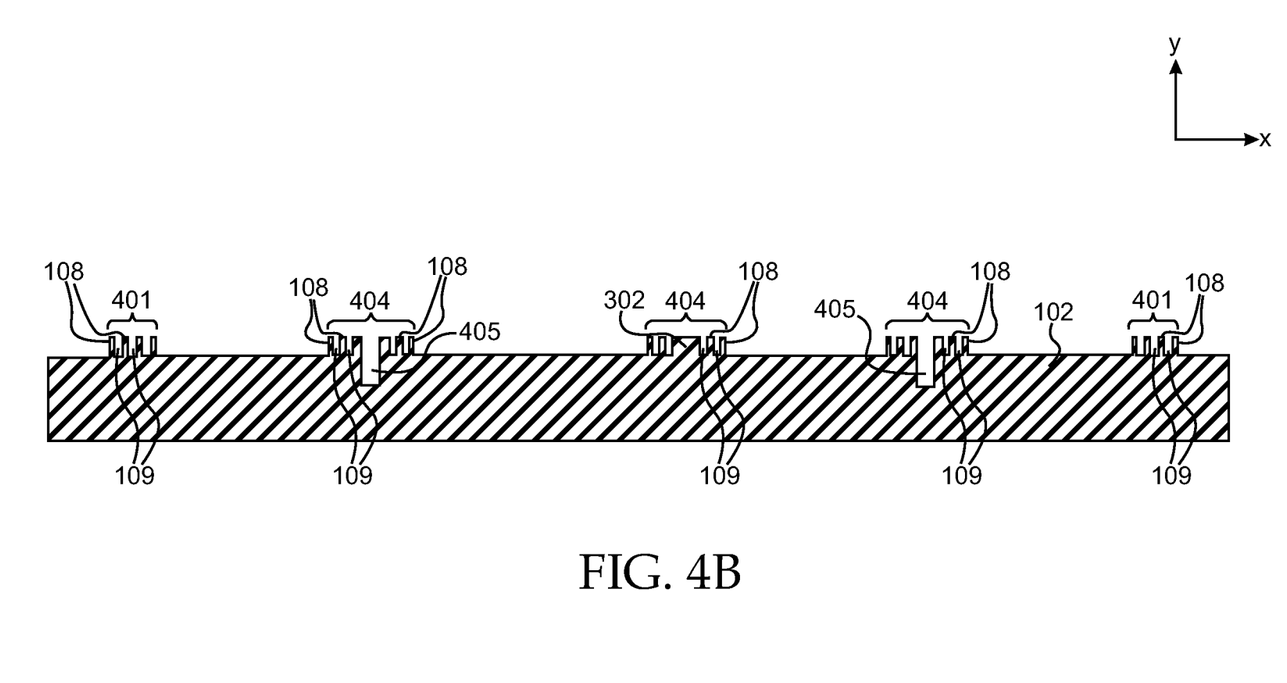
FIG. 4B shows a cross-sectional view of a cap of a semiconductor package in accordance with a representative embodiment.

FIG. 4B shows the cap 102 during fabrication in accordance with a representative embodiment. The cap 102 comprises the seal ring 401 with columns 108 and grooves 109 formed by a dry etching method such as described above. The cap 102 also comprises treads 404 comprising columns 108 and grooves 109 formed by a dry etching method such as described above. Grooves 405 are etched into the cap 102 as shown and, after thinning of the cap 102, provide vias (e.g., first and second vias 113, 117) from the outer surface to the inner surface of the cap 102. Center column 302 is selectively provided on the treads 404 as shown. Center column(s) 302 is also fabricated by dry etching and generally has a width (x-direction in the coordinate system of FIG. 4B) of approximately 15.0 μm to approximately 20.0 μm. As noted above, center columns 302 are provided in all treads 404 where a via (e.g. first and second vias 113, 117) is needed through the cap 102 and are etched to provide grooves 405 for vias. In cases where vias are not provided (e.g., see first contact 107), the center columns 302 are not etched after being formed.

Figure 4C:
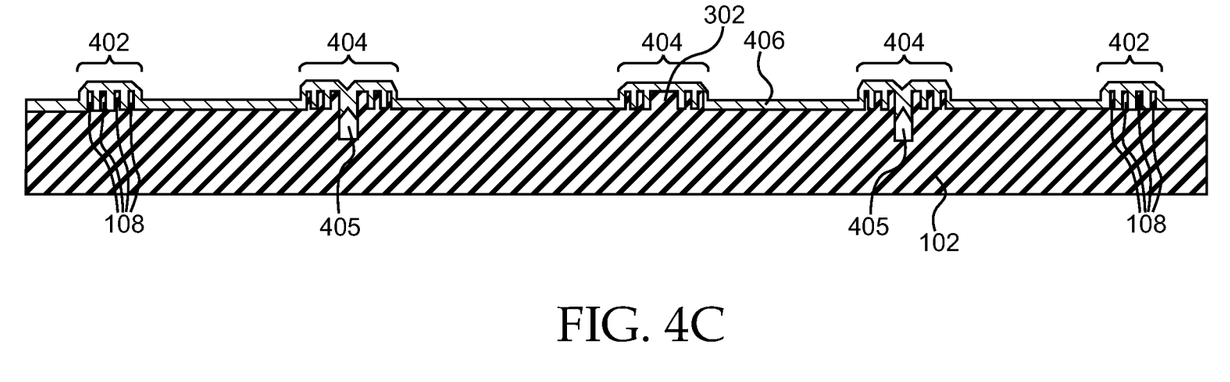
FIG. 4C shows a cross-sectional view of a cap of a semiconductor package in accordance with a representative embodiment.

FIG. 4C shows a cross-sectional view of the cap 102 of semiconductor package 400 in accordance with a representative embodiment. The cap 102 is shown in FIG. 4C after the formation of electrically conductive material 406 over the seal ring 401, the treads 404 and in grooves 405. The electrically conductive material 406 illustratively comprises one or more of titanium (Ti), titanium nitride (TiN), titanium tungsten (TiW), Titanium Tungsten Oxynitride (TiWON), and gold (Au). More generally, the electrically conductive material 407 comprises a stack of adhesion layer/diffusion barrier/adhesion layer/gold. For example, the stack of the electrically conductive material 406 is TiW/TiWON/TiW/Au. Each TiW layer has a thickness of approximately 150 A to approximately 300 A; the TiWON layer has a thickness of approximately 500 A to approximately 1000 A; and the gold layer has a thickness of approximately 1.0 μm to approximately 3.0 μm. In a representative embodiment, the TiW and TiWON layers are deposited by a known sputter deposition method. Alternatively, the TiW and TiWON could be provided by a known evaporation method. The gold layer is deposited by a known sputtering method. As noted above, the outer most layer of the stack is illustratively gold, so that the gold layer makes immediate contact with the substrate 101 upon bonding of the cap 102 to the substrate 101. Notably, in certain embodiments, after selective removal of the electrically conductive material 406, the remaining material forms the bonding layer 402, the electrical connection 111, the first contact 107, the second contact 112, and the third contact 115.

Figure 4D:
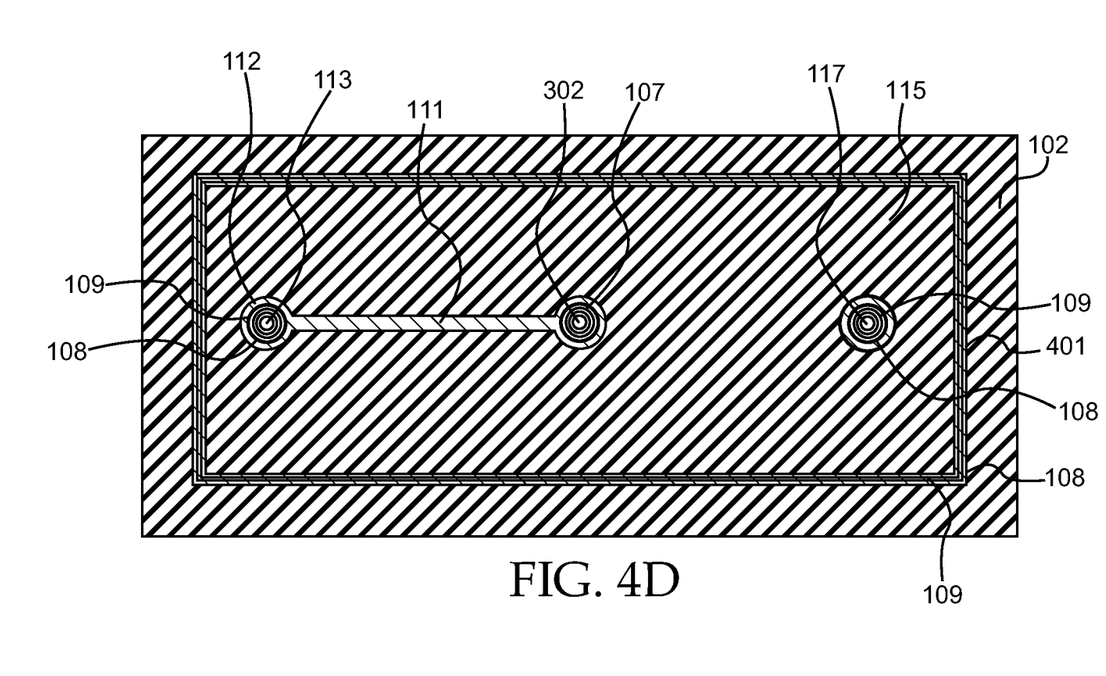
FIG. 4D shows a top view of the cap of the semiconductor package shown in FIG. 4C.

FIG. 4D shows a top view of the cap 102 of the semiconductor package shown in FIG. 4C, and after selective removal of electrically conductive material 406. As such, the first contact 107 is connected to the second contact 112 by electrical connection 111 formed over the inner surface of the cap 102. The third contact 115 is positioned for vertical contact with the ohmic contact 116 of the n-doped region 106 in the representative embodiment.

Normally, in view of opaque nature of the materials selected for the "stack" of the electrically conductive material 406, the details of the first, second and third contacts 107, 112, 115 and the seal ring 401 would not be discernable from a top view such as shown in FIG. 4D. However, in the interest of simplicity these are shown as though the electrically conductive material 406 were transparent. As such, columns 108, grooves 109, and center column 302 are discernable in FIG. 4D.

The seal ring 401 is disposed about a perimeter of the cap 102. As noted above, upon bonding of the cap 102 to the substrate 101 via the seal ring 401, a substantially hermetic seal is provided in the region "within" the seal ring 401, including gap 104. As such, active semiconductor devices (e.g., PIN diode), passive electrical components (not shown) and electrical circuitry (not shown) provided over the inner surface of the substrate 101 and within the seal ring 401 are substantially hermetically sealed and require no additional/external packaging. As described above, the bonding layer 402 is provided between the treads of the seal ring 401 and the layer 403 on the substrate 101. Application of pressure and heat causes the seal ring 401 to form a thermocompression bond with the bonding layer 402 and the layer 403 on the inner surface of the substrate 101, and thereby to form a substantially hermetic seal between the substrate 101 and the cap 102.

Figure 4E:
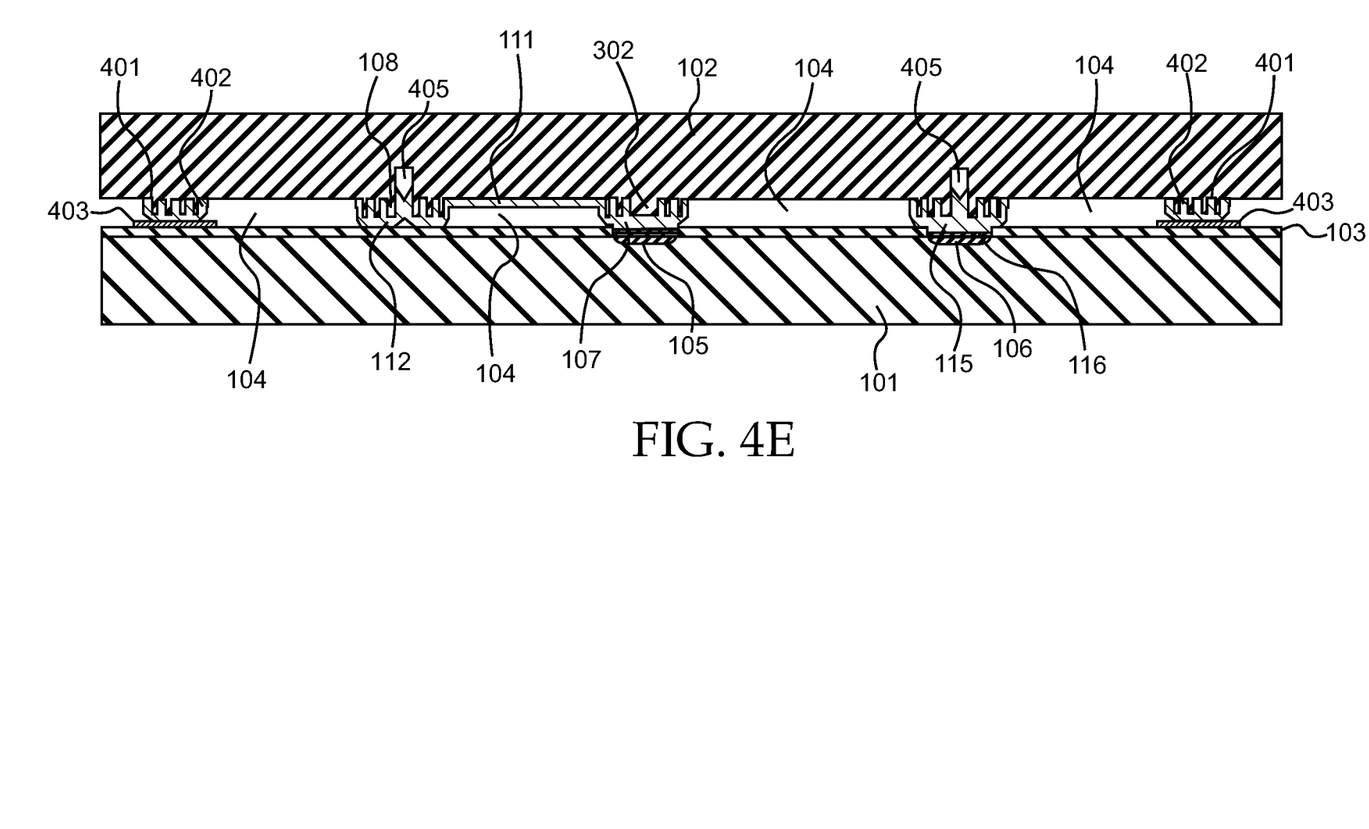
FIG. 4E shows a cross-sectional view of a semiconductor package in accordance with a representative embodiment.

FIG. 4E shows a cross-sectional view of a semiconductor package in accordance with a representative embodiment.

Specifically, FIG. 4E shows the cap 102 bonded to the substrate 101, and prior to thinning of the cap 102 to reveal first and second vias 113, 117, and prior to forming of first and second contact pads 114,118, respectively.

The cap 102 is provided over the substrate 101 and aligned so that first contact 107 is in contact with the ohmic contact 110 over p-doped region 105; and so that the third contact 115 is in contact with the ohmic contact 116 of n-doped region 106. Moreover, as noted above, the bonding layer 402 disposed over the seal ring 401 is aligned with layer 403 disposed over the inner surface of the substrate 101.

After the cap 102 is properly aligned over the substrate 101, the bonding of the cap 102 to the substrate 101 via the seal ring 401, the first contact 107, the second contact 112 and the third contact 115 is effected. As noted above, in a representative embodiment, the outermost gold layer of the bonding layer 402 is bonded to the gold layer of the layer 403 using heat and pressure to provide a thermocompression bond. This thermocompression bond creates a substantially hermetic seal between the substrate 101 and the cap 102.

After the cap 102 is bonded to the substrate 101 according to the representative methods described above, the outer surface of the cap 102 is thinned to a depth that reveals the grooves 405. As a result of this thinning sequence, the first and second vias 113, 117 are formed from the outer surface of the cap 102 through to the inner surface of the cap 102, such as shown in FIG. 4A. In a representative embodiment, the thinning of the cap 102 to reveal the first and second vias 113, 117 is effected using a known wafer thinning method such as back-grinding.

Finally, after the thinning of the cap 102 is completed, the electrically conductive material is provided to fill the first and second vias 113,117, and to form the first contact pad 114 and the second contact pad 118 as shown in FIG. 4A. Illustratively, the first contact pad 114 and the second contact pad 118 each comprise a "stack" of one or more of titanium (Ti), titanium nitride (TiN), titanium tungsten (TiW), Titanium Tungsten Oxynitride (TiWON), and gold. Illustratively, the stack comprises TiW/TiWON/TiW/Au. Each TiW layer has a thickness of approximately 150 A to approximately 300 A; the TiWON layer has a thickness of approximately 500 A to approximately 1000 A; and the gold layer has a thickness of approximately 2000 A. After patterning the first and second contact pads 114,118, gold is plated over the first and second contact pads 114,118 and in the first and second vias 113,117. Illustratively, the plated gold layer has a thickness of approximately 1.0 µm to approximately 5.0 µm.

Figure 5A:
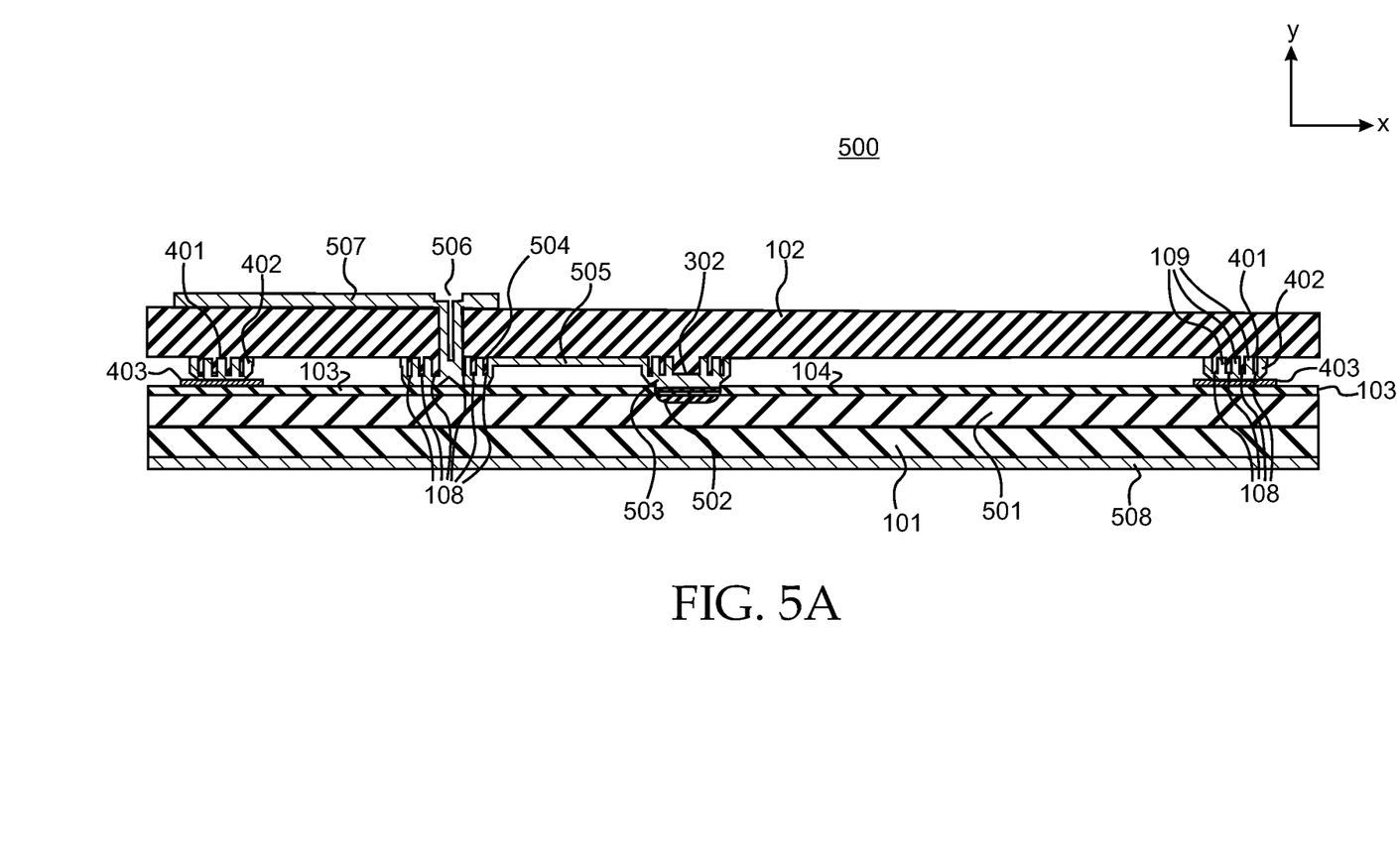
FIG. 5A shows a cross-sectional view of a semiconductor package in accordance with a representative embodiment.

FIG. 5A shows a cross-sectional view of a semiconductor package 500 in accordance with a representative embodiment. The semiconductor package 500 includes features common to those described above in connection with representative embodiments of FIGS. 1-4E. Generally, the details of these common features are not repeated in order to avoid obscuring the description of the semiconductor package.

The semiconductor package 500 comprises substrate 101 and cap 102 disposed over the substrate 101. The optional passivation layer 103 is provided over the substrate 101, and the gap 104 is provided between the substrate 101 and the cap 102.

In a representative embodiment, the active semiconductor device is a two terminal device or a three terminal device. For purposes of illustration, the two terminal device is a PIN diode. Notably, the PIN diode of the representative embodiment of FIG. 5A is a "vertical" (y-direction in the coordinate system of FIG. 5A) PIN diode.

The substrate 101 comprises n-type semiconductor (e.g., Si) doped to a suitable level for a PIN diode. A layer 501 of intrinsic semiconductor is provided over the substrate 101. The layer 501 may be an epitaxially grown semiconductor layer, or may be a layer of intrinsic semiconductor fused to the substrate 101 by a known method. As such, the PIN diode is formed between a p-doped region 502, the layer 501 and the n-type substrate 101. Alternatively, a PIN diode could be formed with an n-doped region (not shown), layer 501 of intrinsic semiconductor and substrate 101 being p-type semiconductor.

It is once again emphasized that the "vertical" PIN diode is merely illustrative of the active device of the semiconductor package 500, and that other two terminal (e.g., e.g., Schottky diode, or p-n junction diode) "vertical" devices are contemplated for inclusion in the semiconductor package 500 and may be formed in and over the substrate 101 by known methods using known materials. Furthermore, three terminal active semiconductor devices such as bipolar transistors, pseudomorphic high electron mobility transistors (pHEMT) and metal oxide semiconductor (MOS) transistors are contemplated for inclusion in the semiconductor package 500. Finally, the present teachings contemplate the inclusion of bulk acoustic wave (BAW) devices such as film bulk acoustic wave resonators (FBARs) and supporting active semiconductor devices, passive electrical components and circuitry in the semiconductor package 500. Such three terminal devices, BAW devices and supporting active semiconductor devices, passive electrical components and circuitry may be formed in and over the substrate 101 by known methods using known materials.

A first contact 503 comprises center column 302, columns 108 and grooves 109 formed in the cap 102, with electrically conductive material provided over the columns 108 and in the grooves 109. As described above, the electrically conductive material illustratively comprises a multi-layer stack (e.g., TiW/TiWON/TiW/Au), and columns 108 and grooves 109 form a "tread" that fosters strong mechanical bonding between the cap 102 and the substrate 101, and a good electrical connection, as needed.

A second contact 504 comprises columns 108 and grooves 109 formed in the cap 102. The second contact 504 comprises electrically conductive material provided over the columns 108 and in the grooves 109. Again, the electrically conductive material illustratively comprises a multi-layer stack (e.g., TiW/TiWON/TiW/Au), and columns 108 and grooves 109 form a "tread" that fosters strong mechanical bonding between the cap 102 and the substrate 101, and a good electrical connection, as needed.

An electrical connection 505 connects the first contact 503 to the second contact 504. The electrical connection 505 is provided over an inner surface of the cap 102 and illustratively comprises a multi-layer stack (e.g., TiW/TiWON/TiW/Au).

A via 506 is provided through the cap 102 and connects the second contact 504 to a first contact pad 507 disposed over an outer surface of the cap 102 as shown. The via 506 and the first contact pad 507 illustratively comprise a multi-layer stack (e.g., TiW/TiWON/TiW/Au) with a comparatively thick gold layer (e.g., approximately 1.0 µm to approximately 2.0 µm) provided as the outer most layer of the stack. In the representative embodiment, the first contact pad 507 is ultimately electrically connected to the p-doped region 502 and thus forms an anode of the PIN diode.

A second contact pad 508 is provided over the outer surface of the substrate 101 of the semiconductor package 500. In the representative embodiment, the second contact pad is an $n^+$ type contact comprising a known ohmic metal suitable for n-type contacts. Illustratively, the second contact pad 508 comprises metal (e.g., Au or AsAu) on the backside of the substrate 101 and has a thickness of approximately 1.0 µm to approximately 5 µm. The second contact pad 508 may be formed by sputtering, evaporation, or a combination thereof. The second contact pad 508 forms the cathode of the illustrative PIN diode.

The semiconductor package 500 comprises seal ring 401 disposed parametrically about the cap 102 and contacting the substrate 101 as shown. The seal ring 401 comprises columns 108 and grooves 109 as described above. Bonding layer 402 is provided over the columns 108 and in the grooves 109 as shown. As noted above, the bonding layer 402 comprises a material useful in providing a substantially hermetic seal between the substrate 101 and the cap 102. As such, the active semiconductor device (e.g., PIN diode shown in FIG. 5A), any other active semiconductor devices (not shown), passive electrical components (not shown) and circuitry provided between the substrate 101 and the cap 102, and "within" the perimeter formed by the seal ring 401 are substantially hermetically sealed and generally require no additional/external packaging.

The "tread" structure accorded by the columns 108 and grooves 109 of the seal ring 401 allows for the secured bonding with the bonding layer 402 of the substrate 101 to the cap 102. Notably, when the cap 102 contacts the substrate 101 during the sealing process, the application of pressure (in the -y direction of the coordinate system of FIG. 4A) and the application of heat causes the columns 108 and grooves 109 to form a comparatively secure bond between the cap 102 and the substrate 101.

The "vertical" active semiconductor device (e.g., PIN diode) of the representative embodiment of the semiconductor package 500 FIG. 5A provides certain benefits. As described above, this vertical (y-dimension of the coordinate system shown in FIG. 5A) separation reduces the capacitive coupling between the active semiconductor device of the semiconductor package 500 and electrical contacts to the active semiconductor device. Moreover, in certain applications, it is useful for the layer 501 of the PIN diode to be comparatively thick (y-dimension of the coordinate system shown in FIG. 5A). For example, in certain applications the layer 501 needs to be approximately 200 µm to approximately 500 µm. As can be appreciated, in a "horizontal" device (e.g., the PIN diode shown in FIG. 4A), the area of the semiconductor package may be unacceptably large if a comparatively "wide" (x-dimension in the coordinate systems of FIGS. 4A and 5A) intrinsic layer is needed. By contrast, the "vertical" PIN diode of the representative embodiments can be provided in a comparatively reduced area.

Figure 5B:
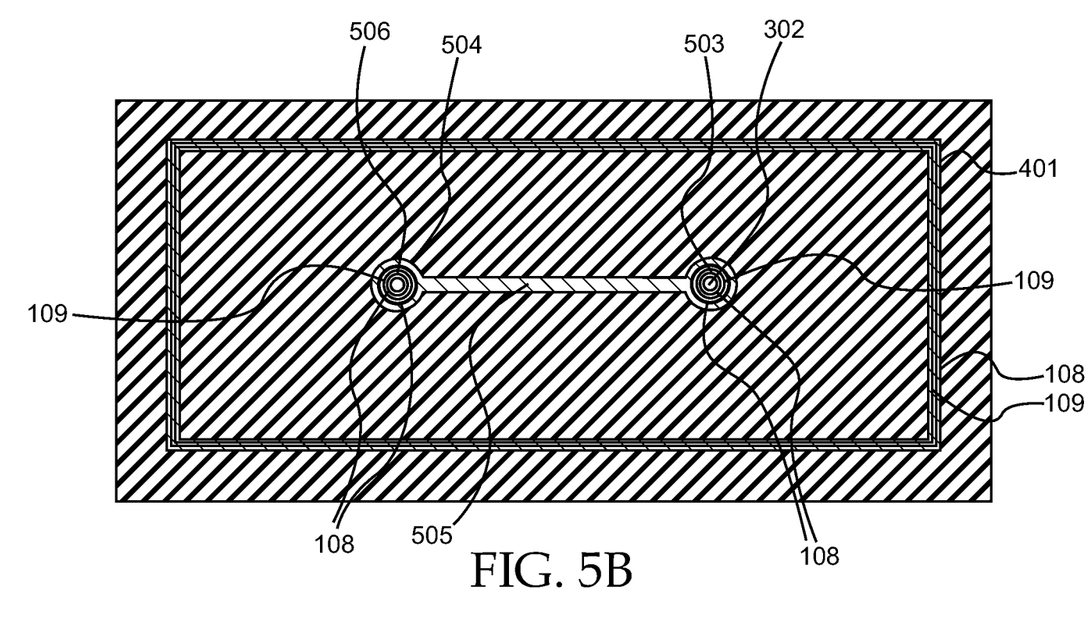
FIG. 5B shows a top view of the cap of the semiconductor package shown in FIG. 5A.

FIG. 5B shows a top view of the cap 102 of the semiconductor package shown in FIG. 5A. As such, the first contact 503 is connected to the second contact 504 by electrical connection 505 formed over the inner surface of the cap 102.

Normally, in view of opaque nature of the materials selected for the "stack" of the electrically conductive material used for the first contact 503, the second contact 504, electrical connection 505, and seal ring 401, the details of the first contact 503, the second contact 504, electrical connection 505, and seal ring 401 would not be discernable from a top view such as shown in FIG. 4D. However, in the interest of simplicity these are shown as though the electrically conductive material were transparent. As such, center column 302, columns 108 and grooves 109 are discernable in FIG. 5B.

The semiconductor packages of the representative embodiments can be implemented in a variety of materials and variant structures. Further, the various methods of fabrication, materials, structures and parameters are included by way of example only and not in any limiting sense. In view of this disclosure, those skilled in the art can implement the present teachings in determining their own applications and needed materials and equipment to implement these applications, while remaining within the scope of the appended claims.

The invention claimed is:
1. A semiconductor package, comprising:
a substrate comprising a semiconductor device;
a cap comprising a seal ring disposed over a surface of the cap, the seal ring comprising a tread comprising at least two columns, wherein one of the at least two columns has a greater width than a width of another of the at least two columns; and
a gap between the substrate and the surface of the cap.
2. A semiconductor package as claimed in claim 1, wherein the tread comprises grooves between the columns, and a bonding layer is disposed in the grooves and over the columns.
3. A semiconductor package as claimed in claim 2, wherein the bonding layer bonds the tread to the substrate.
4. A semiconductor package as claimed in claim 3, wherein the bonding layer comprises an electrically conductive material.
5. A semiconductor package as claimed in claim 1, wherein seal ring is disposed about a perimeter of the cap.
6. A semiconductor package as claimed in claim 1, wherein the gap comprises a gas or a vacuum.
7. A semiconductor package as claimed in claim 1, further comprising:
a contact comprising a second tread disposed over the surface of the cap, the second tread comprising at least two columns, wherein the contact comprises a via between the surface of the cap and an opposing surface of the cap.
8. A semiconductor package as claimed in claim 7, wherein the second tread comprises grooves between the at least two columns, and an electrically conductive material is disposed in the via, in the grooves and over the columns.
9. A semiconductor package as claimed in claim 7, wherein the contact is in physical contact with an ohmic contact of a doped region in the substrate, and is electrically connected to the semiconductor device.
10. A semiconductor package as claimed in claim 9, further comprising a second contact electrically connected to the semiconductor device and comprising a third tread disposed over the surface of the cap, the third tread comprising at least two columns, wherein the second contact comprises a second via between the surface of the cap and the opposing surface of the cap.
11. A semiconductor package as claimed in claim 9, wherein the substrate comprises: a surface adjacent to the gap, and an opposing surface, wherein the semiconductor package further comprises a contact pad disposed over the opposing surface of the substrate and electrically connected to the semiconductor device.
12. A semiconductor package, comprising:
a substrate comprising a p-type semiconductor, intrinsic (i) semiconductor, n-type semiconductor (PIN) diode;
a cap comprising a seal ring disposed over a surface of the cap, the seal ring comprising a tread comprising at least two columns, wherein one of the at least two columns has a greater width than a width of another of the at least two columns; and
a gap between the substrate and the surface of the cap.

13. A semiconductor package as claimed in claim 12, wherein the tread comprises grooves between the columns, and a bonding layer is disposed in the grooves and over the columns.

14. A semiconductor package as claimed in claim 13, wherein the bonding layer bonds the tread to the substrate.

15. A semiconductor package as claimed in claim 14, wherein the bonding layer comprises an electrically conductive material.

16. A semiconductor package as claimed in claim 12, wherein seal ring is disposed about a perimeter of the cap.

17. A semiconductor package as claimed in claim 12, wherein the gap comprises a gas or a vacuum.

18. A semiconductor package as claimed in claim 12, further comprising:
 a contact comprising a second tread disposed over the surface of the cap, the second tread comprising at least two columns, wherein the contact comprises a via between the surface of the cap and an opposing surface of the cap.

19. A semiconductor package as claimed in claim 18, wherein the second tread comprises grooves between the at least two columns, and an electrically conductive material is disposed in the via, in the grooves and over the columns.

20. A semiconductor package as claimed in claim 19, wherein the contact is in physical contact with an ohmic contact of a doped region of the PIN diode, and is electrically connected to the PIN diode.

21. A semiconductor package as claimed in claim 20, further comprising:
 a second contact electrically connected to the PIN diode and comprising a third tread disposed over the surface of the cap, the third tread comprising at least two columns, wherein the second contact comprises a second via between the surface of the cap and the opposing surface of the cap, and the second contact is electrically connected to the PIN diode.

22. A semiconductor package as claimed in claim 20, wherein the substrate comprises: a surface adjacent to the gap, and an opposing surface, wherein the semiconductor package further comprises a contact pad disposed over the opposing surface of the substrate and electrically connected to the PIN diode.

\* \* \* \* \*